(12) United States Patent
McChesney et al.

(10) Patent No.: US 9,711,459 B2
(45) Date of Patent: Jul. 18, 2017

(54) MULTI-LAYER SUBSTRATE WITH AN EMBEDDED DIE

(71) Applicant: RF Micro Devices, Inc., Greensboro, NC (US)

(72) Inventors: Bryan McChesney, Summerfield, NC (US); John Avery Capwell, Greensboro, NC (US); Mark Alan Crandall, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/133,995

(22) Filed: Apr. 20, 2016

(65) Prior Publication Data

US 2017/0025358 A1   Jan. 26, 2017

Related U.S. Application Data

(60) Provisional application No. 62/194,340, filed on Jul. 20, 2015.

(51) Int. Cl.
*H01L 23/538* (2006.01)
*H01L 23/00* (2006.01)

(52) U.S. Cl.
CPC ...... *H01L 23/5389* (2013.01); *H01L 23/5383* (2013.01); *H01L 23/5384* (2013.01); *H01L 24/09* (2013.01); *H01L 24/32* (2013.01); *H01L 2224/05082* (2013.01); *H01L 2224/05124* (2013.01); *H01L 2224/05144* (2013.01); *H01L 2224/05147* (2013.01); *H01L 2224/05155* (2013.01); *H01L 2224/2919* (2013.01); *H01L 2224/32225* (2013.01); *H01L 2924/01073* (2013.01); *H01L 2924/0535* (2013.01); *H01L 2924/05042* (2013.01); *H01L 2924/05442* (2013.01); *H01L 2924/0665* (2013.01);
(Continued)

(58) Field of Classification Search
None
See application file for complete search history.

(56) References Cited

U.S. PATENT DOCUMENTS

2011/0062549 A1* 3/2011 Lin ...................... H01L 23/3128
257/531

OTHER PUBLICATIONS

Kamgaing, Telesphor et al., "Embedded RF Passives Technology Using a Combination of Multilayer Organic Package Substrate and Silicon-Based Integrated Passive Devices," Proceedings of the 2010 60th Electronic components and Technology Conference (ECTC), Jul. 2010, IEEE, pp. 1547-1551.
(Continued)

*Primary Examiner* — Daniel Whalen
(74) *Attorney, Agent, or Firm* — Withrow & Terranova, P.L.L.C.

(57) ABSTRACT

The present disclosure relates to a multi-layer substrate structure with an embedded die to miniaturize designs and improve performance. The multi-layer substrate structure includes a core layer having a cavity and a die mounted within the cavity. The die has a die body, a die conductive element on a top surface of the die body, and a dielectric layer over the die conductive element. The multi-layer substrate structure also includes a substrate conductive element formed over a portion of a top surface of the core layer and extending over at least a portion of the die conductive element. Overlapping portions of the die conductive element and the substrate conductive element are separated by the dielectric layer and form an electronic component.

20 Claims, 7 Drawing Sheets

(52) U.S. Cl.
CPC .............. *H01L 2924/07025* (2013.01); *H01L 2924/15153* (2013.01); *H01L 2924/19011* (2013.01); *H01L 2924/19041* (2013.01); *H01L 2924/19042* (2013.01); *H01L 2924/19104* (2013.01); *H01L 2924/2064* (2013.01)

(56) References Cited

OTHER PUBLICATIONS

Yook, Jong-Min et al., "Embedded Passive and Active Package using Silicon Substrate," 2011 13th Electronics Packaging Technology Conference (EPTC), Dec. 2011, IEEE, pp. 554-557.

\* cited by examiner

MULTI-LAYER SUBSTRATE WITH AN EMBEDDED DIE

RELATED APPLICATIONS

This application claims the benefit of U.S. provisional patent application No. 62/194,340, filed Jul. 20, 2015, the disclosure of which is incorporated herein by reference in its entirety.

FIELD OF THE DISCLOSURE

The present disclosure relates to a multi-layer substrate structure with an embedded die, and more particularly to a multi-layer substrate structure with an embedded die to miniaturize designs and improve performance.

BACKGROUND

With the popularity of portable consumer electronic devices, such as smart phones, tablet computers, and so forth, numerous packaging technologies are geared towards electronics miniaturization and densification. Embedding integrated circuit dies into substrates is one of these packaging technologies with a strong potential. Embedding techniques provide a three-dimensional (3D) configuration that offers an attractive interconnect solution without wire bonding, with improved thermal and electrical performance, and the potential to reduce manufacturing cost for complex products.

Figure 1:
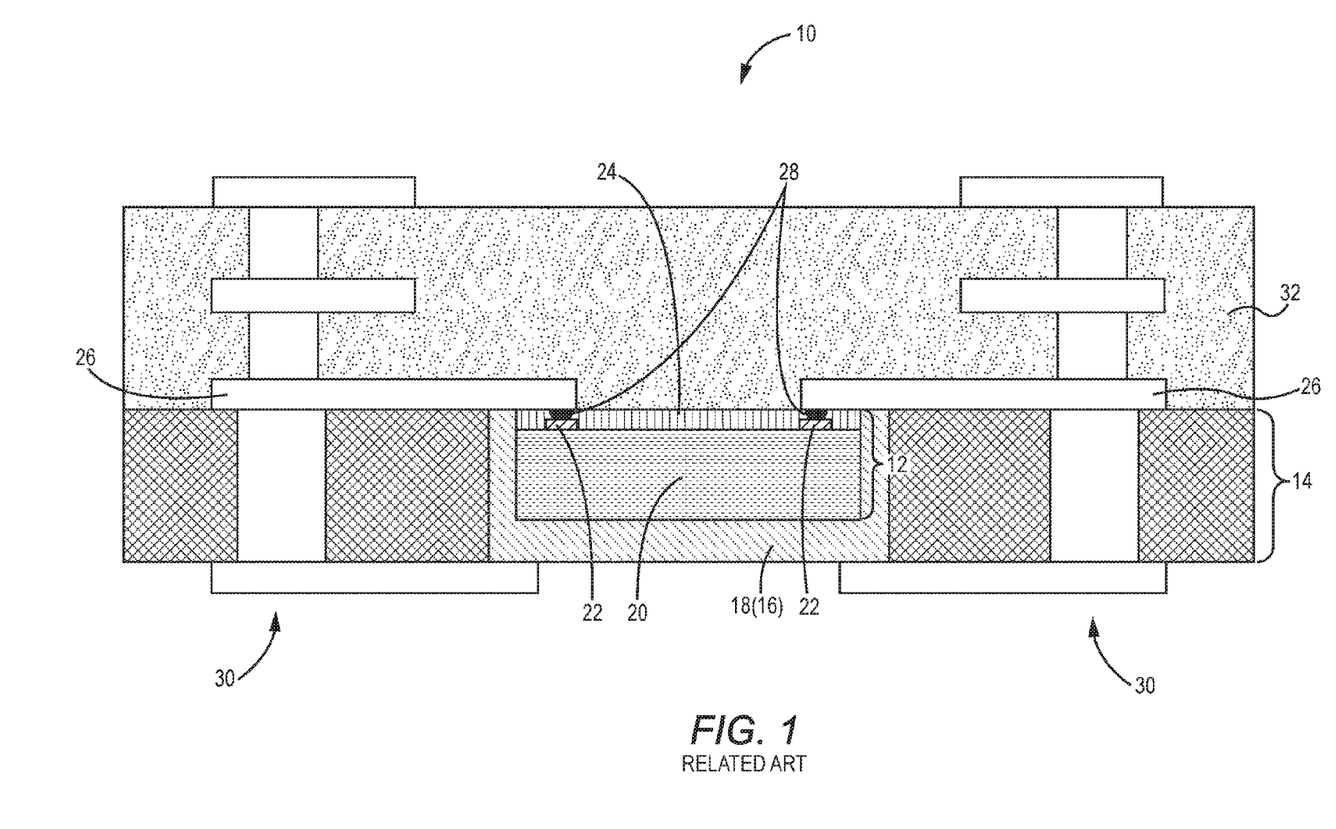
FIG. 1 shows a conventional substrate structure with an embedded die.

FIG. 1 shows a conventional substrate structure 10 with an embedded die 12. The substrate structure 10 includes a core layer 14 having a cavity 16. The die 12 is mounted within the cavity 16 by a mounting material 18. The die 12 includes a die body 20, die conductive elements 22 on a top surface of the die body 20 and a dielectric layer 24 over the die conductive elements 22. The substrate structure 10 also includes substrate conductive elements 26 formed over a portion of a top surface of the core layer 14. Each of the substrate conductive elements 26 is electronically coupled to a corresponding one of the die conductive elements 22 through one of the electronic vias 28. In addition, there are via structures 30 coupled to the substrate conductive elements 26 and formed through the whole substrate structure 10. Outer substrate layers 32 are formed over the core layer 14 to encapsulate the die 12. The substrate structure 10 is a 3D apparatus, which utilizes the die conductive elements 22, the substrate conductive elements 26, and the via structures 30 to electronically redistribute the die 12 to a top surface of the substrate structure 10 without increasing the footprint of the substrate structure 10.

However, for some applications, only embedding a die into a substrate may not meet the size and performance requirement. Passive components and trace length from the substrate to the passive components largely affect the size of the whole design. The trace length from the substrate to the passive components also affects the parasitic capacitance and inductance of the design, and thereby affects load fluctuations and noise of the design.

Accordingly, there remains a need for improved substrate designs with embedded dies to obtain further miniaturization and densification without sacrificing electronic performance or increasing manufacturing complexity.

SUMMARY

The present disclosure relates to a multi-layer substrate structure with an embedded die to miniaturize designs and improve performance. The multi-layer substrate structure includes a core layer having a cavity and a die mounted within the cavity by a mounting material. The die includes a die body, a die conductive element on a top surface of the die body, and a dielectric layer over the die conductive element. In addition, the multi-layer substrate structure also includes a substrate conductive element formed over a portion of a top surface of the core layer and extending over at least a portion of the die conductive element. Overlapping portions of the die conductive element and the substrate conductive element are separated by the dielectric layer and form an electronic component.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

It will be understood that for clear illustrations, FIGS. 1-4 may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2A:
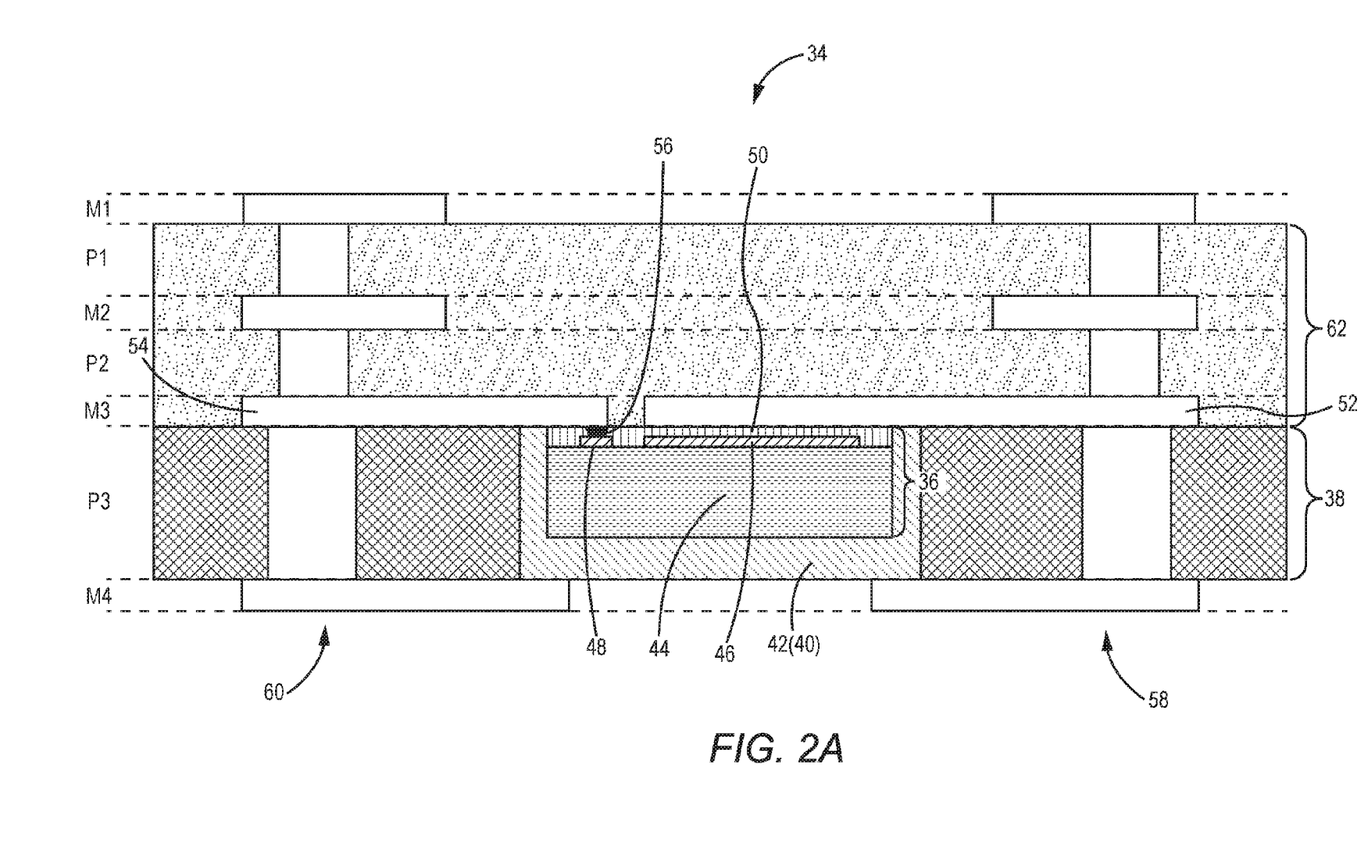
FIGS. 2A-2C show an exemplary multi-layer substrate structure with an embedded die according to one embodiment of the present disclosure.

FIG. 2A provides an exemplary multi-layer substrate structure 34 with an embedded die 36 according to one embodiment of the present disclosure. For the purpose of this illustration, there is only one die 36 included in the multi-layer substrate structure 34. In different applications, the multi-layer substrate structure 34 may include multiple dies. Further, for the purpose of this illustration the multi-layer substrate structure 34 has four metal layers (M1, M2, M3, and M4) and three polymer layers (P1, P2, and P3). In different applications, the multi-layer substrate structure 34 may include fewer or more metal/polymer layers and each metal/polymer layer may have a different thickness.

The multi-layer substrate structure 34 includes a core layer 38 having a cavity 40 residing in the polymer layer P3. The die 36 is mounted at the middle of the cavity 40 by a mounting material 42. The die 36 includes a die body 44, a first die conductive element 46, a second die conductive element 48 and a dielectric layer 50. The first and second die conductive elements 46 and 48 reside on a top surface of the die body 44, and the dielectric layer 50 covers the first and second die conductive elements 46 and 48.

In detail, the core layer 38 is a laminate layer formed of glass reinforced dielectric or non-glass reinforced dielectric. These materials have superior mechanical strength to provide rigidity of the core layer 38. The core layer 38 has a thickness between 5 µm and 250 µm. The die 36 mounted at the middle of the cavity 40 has a thickness between 5 µm and 200 µm. In some applications, the die 36 may exceed the cavity 40 and extend to other metal/polymer layers (not shown). The mounting material 42, which is directly coupled to the die 36 and the core layer 38, may be epoxy, resin, or epoxy resin. The first and second die conductive elements 46 and 48 may be formed of copper, aluminum, gold, or alloy with a thickness between 1 µm and 6 µm. The dielectric layer 50 may be formed of a passivation material such as silicon oxide, silicon nitride, polyamid, and tantalum pentoxide.

The multi-layer substrate structure 34 also includes first and second substrate conductive elements 52 and 54. The first and second substrate conductive elements 52 and 54 may reside in a common metal layer M3, and are electronically isolated. The first substrate conductive element 52 is formed over a portion of a top surface of the core layer 38 and extends over at least a portion of the first die conductive element 46. The first die conductive element 46 is parallel with the first substrate conductive element 52 and overlapping portions of the first die conductive element 46 and the first substrate conductive element 52 are separated by the dielectric layer 50. A top surface of the dielectric layer 50 may be substantially coplanar with the top surface of the core layer 38. Thereby, the first substrate conductive element 52 may be directly in contact with the dielectric layer 50. A typical, but non-limiting, thickness of the dielectric layer 50 between the first die conductive element 46 and the first substrate conductive element 52 is between 0.25 µm and 5 µm. In one embodiment, the overlapping portions of the first die conductive element 46 and the first substrate conductive element 52, and the dielectric layer 50 in-between may be used to form an electronic component such as a capacitor, a coupler, or a transformer, etc.

The second substrate conductive element 54 is formed over a portion of the top surface of the core layer 38 and extends over at least a portion of the second die conductive element 48. The second die conductive element 48 is parallel with the second substrate conductive element 54 and the second die conductive element 48 is electronically coupled to the second substrate conductive element 54 through an electronic via 56. Both the first and second substrate conductive elements 52 and 54 may include a first layer formed of nickel and a second layer formed of copper. For different applications, fewer or more layers may be included in the first and second substrate conductive elements 52 and 54, and different metal materials may be used. A thickness of the first substrate conductive element 52 is between 10 µm and 15 µm and a thickness of the second substrate conductive element 54 is between 10 µm and 15 µm.

As illustrated in FIG. 2A, there are a first via structure 58 and a second via structure 60 formed through all of the metal layers M1, M2, M3, and M4 and the polymer layers P1, P2, and P3 of the multi-layer substrate structure 34. The first via structure 58 is directly coupled to the first substrate conductive element 52 and the second via structure 60 is directly coupled to the second substrate conductive element 54. In this exemplary multi-layer substrate structure 34, the core layer 38 resides at a bottom portion of the multi-layer substrate structure 34. There are outer substrate layers 62 formed over the core layer 38 to encapsulate the die 36, the first and second substrate conductive elements 52 and 54, and portions of the first and second via structures 58 and 60. The outer substrate layers 62 may be formed of epoxy, resin, or epoxy resin. The material used to form the outer substrate layers 62 may be the same as the mounting material 42.

Figure 2B:
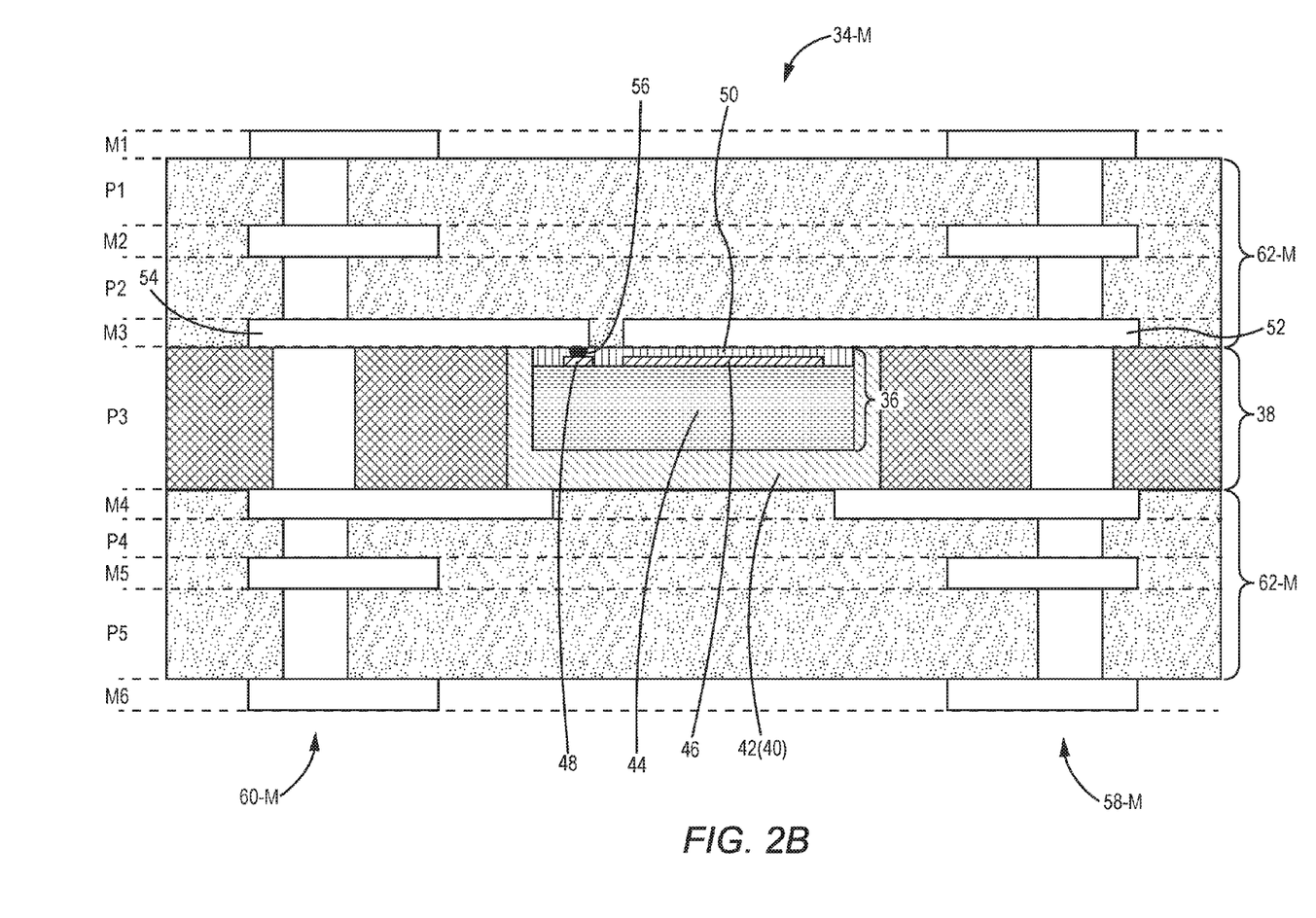

It will be obvious to those skilled in the art that it is also possible that a core layer may reside at different portions of a multi-layer substrate structure. FIG. 2B provides an exemplary multi-layer substrate structure 34-M with the core layer 38 residing at a middle portion of the multi-layer substrate structure 34-M according to one embodiment of the present disclosure. The multi-layer substrate structure 34-M has six metal layers (M1, M2, M3, M4, M5, and M6) and five polymer layers (P1, P2, P3, P4, and P5) and the core layer 38 resides in the middle polymer layer P3. Within this multi-layer substrate structure 34-M, a first via structure 58-M that is directly coupled to the first substrate conductive element 52 and a second via structure 60-M that is directly coupled to the second substrate conductive element 54 are formed through all of the metal layers M1, M2, M3, M4, M5, and M6 and the polymer layers P1, P2, P3, P4, and P5 of the multi-layer substrate structure 34-M. Outer substrate layers 62-M are formed on opposite sides of the core layer 38 to encapsulate the die 36, the first and second substrate conductive elements 52 and 54, and portions of the first and second via structures 58-M and 60-M.

Figure 2C:
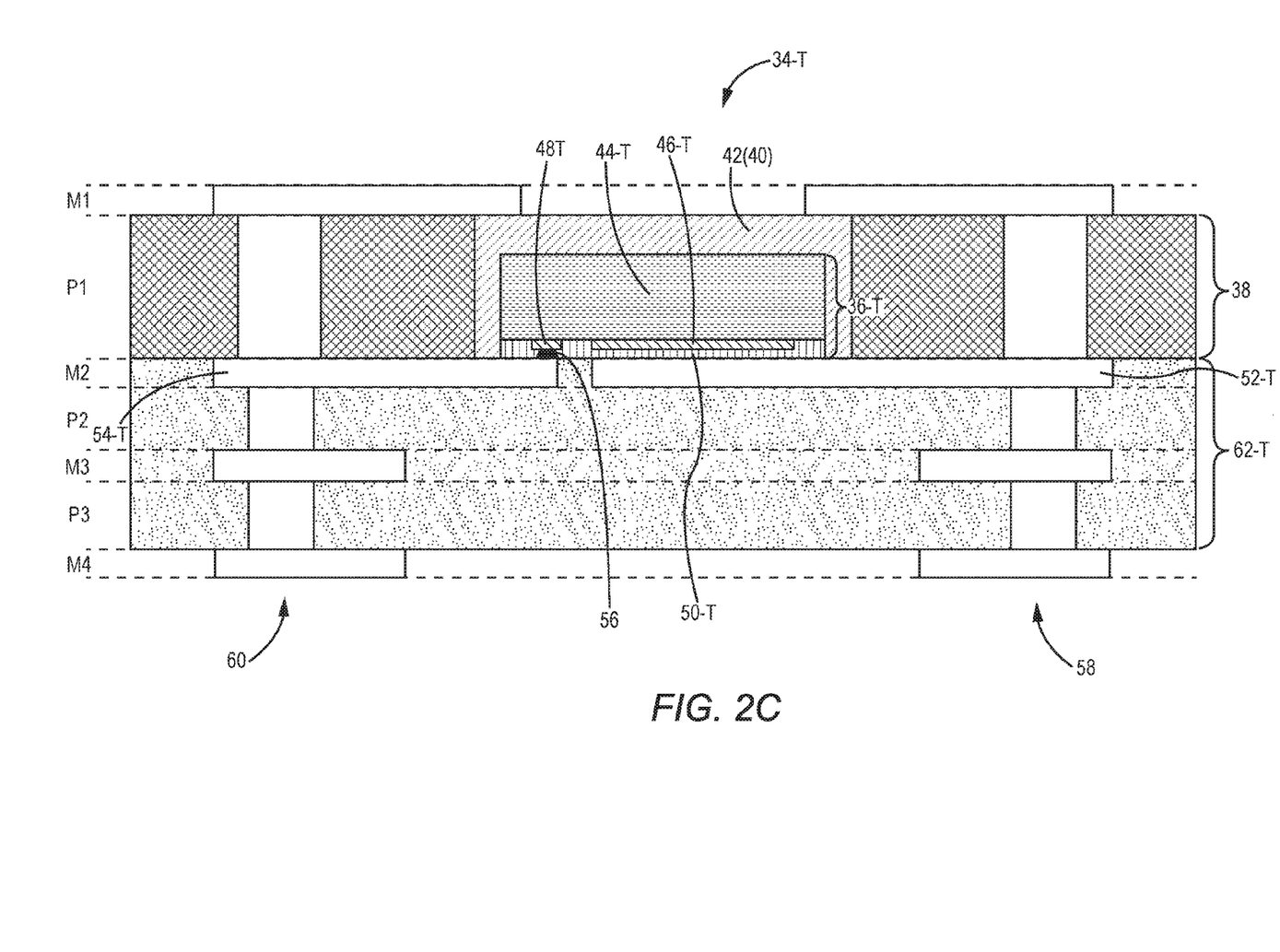

Further, the core layer 38 may reside at a top portion of a multi-layer substrate structure 34-T as shown in FIG. 2C. The multi-layer substrate structure 34-T has four metal layers (M1, M2, M3, and M4) and three polymer layers (P1, P2, and P3) and the core layer 38 resides in the top polymer layer P1. A die 36-T mounted at the middle of the cavity 40 includes a die body 44-T, a first die conductive element 46-T, a second die conductive element 48-T, and a dielectric layer 50-T. The first and second die conductive elements 46-T and 48-T reside on a bottom surface of the die body 44-T, and the dielectric layer 50-T covers the first and second die conductive elements 46-T and 48-T. First and second substrate conductive elements 52-T and 54-T may reside in a common metal layer M2, and are electronically isolated. The first substrate conductive element 52-T resides on a portion of a bottom surface of the core layer 38 and extends over at least a portion of the first die conductive element 46-T. The second substrate conductive element 54-T resides on a portion of the bottom surface of the core layer 38 and is electronically coupled to the second die conductive element 48-T. Outer substrate layers 62-T are formed underneath the core layer 38 to encapsulate the die 36-T, the first and second substrate conductive elements 52-T and 54-T, and portions of the first and second via structures 58 and 60.

Figure 3:
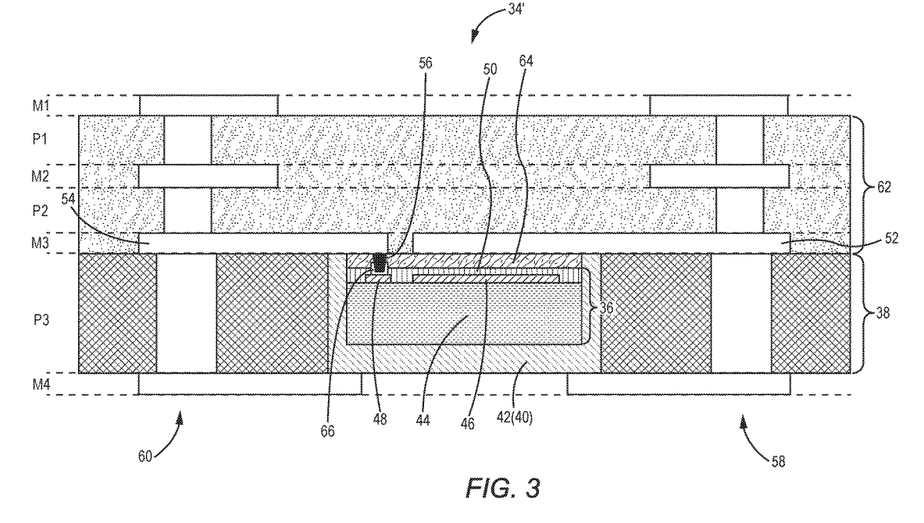
FIG. 3 shows an exemplary multi-layer substrate structure with an embedded die according to one embodiment of the present disclosure.

With different manufacturing technologies, the die 36 may be mounted at different locations within the cavity 40. As illustrated in FIG. 3, the top surface of the dielectric layer 50 of the die 36 may not be coplanar with the top surface of the core layer 38. A second dielectric layer 64 is sandwiched between the first substrate conductive element 52 and the dielectric layer 50. The second dielectric layer 64 may be formed of silicon oxide, silicon nitride, polyamid, or tantalum pentoxide. Herein the dielectric layer 50 and the second dielectric layer 64 may be formed of different materials. In this exemplary multi-layer substrate structure 34', a thickness of the second dielectric layer 64 is between 2 μm and 10 μm, and a thickness of the dielectric layer 50 between the first die conductive element 46 and the second dielectric layer 64 is between 0.25 μm and 5 μm. In one embodiment, the overlapping portions of the first die conductive element 46 and the first substrate conductive element 52, and the combination dielectric layers in-between (the dielectric layer 50 and the second dielectric layer 64) may be used to form an electronic component such as a capacitor, a coupler, or a transformer, etc. In some applications, the dielectric layer 50 is optional, the second dielectric layer 64 may be directly coupled to the first die conductive element 46 and the first substrate conductive element 52.

In the multi-layer substrate structure 34', there may be a metal bump 66 that resides on top of the second die conductive element 48. The second substrate conductive element 54 is electronically coupled to the metal bump 66 through the electronic via 56. Normally, the electronic via 56 may go through almost all of the metal bump 66 and the dielectric layer 50 may be not over the metal bump 66. The metal bump 66 may be formed of copper with a thickness between 5 μm and 10 μm.

Figure 4A:
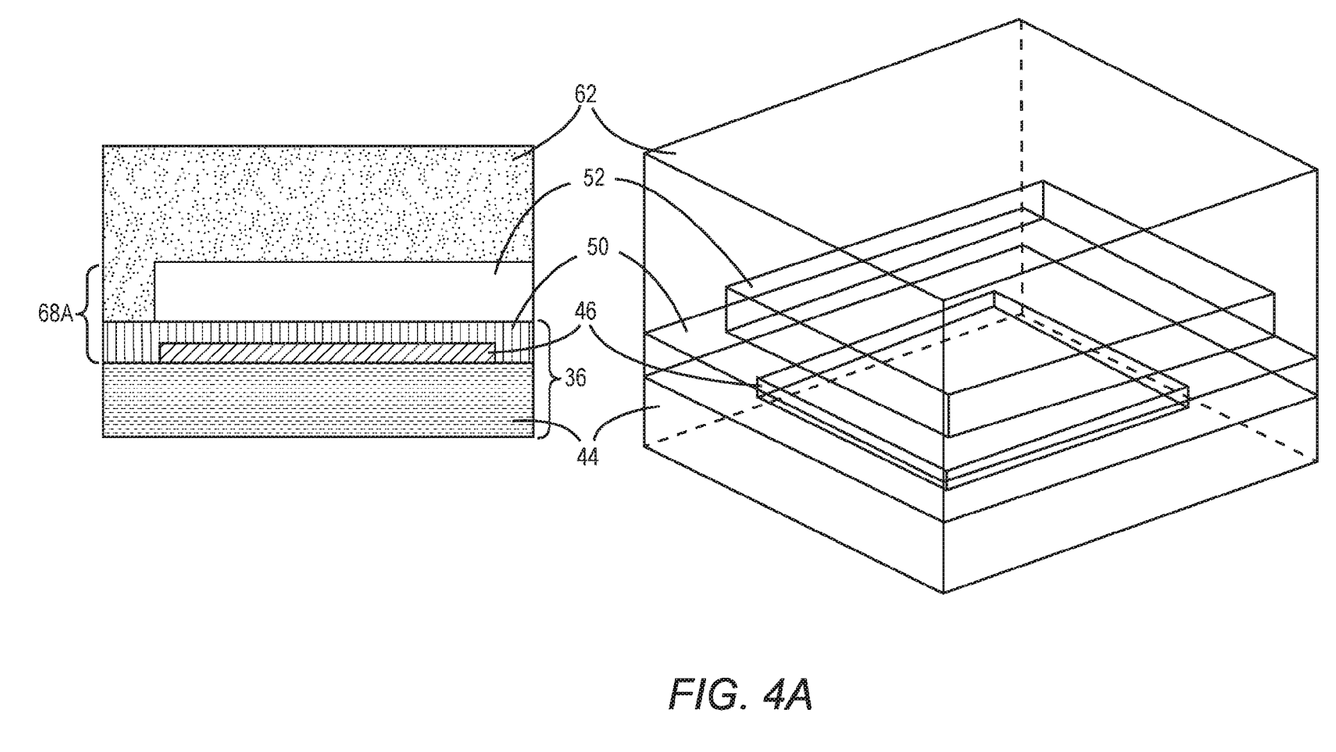
FIGS. 4A-4B show exemplary electronic components formed inside the exemplary multi-layer substrate structure provided in FIG. 2A.
Figure 4B:
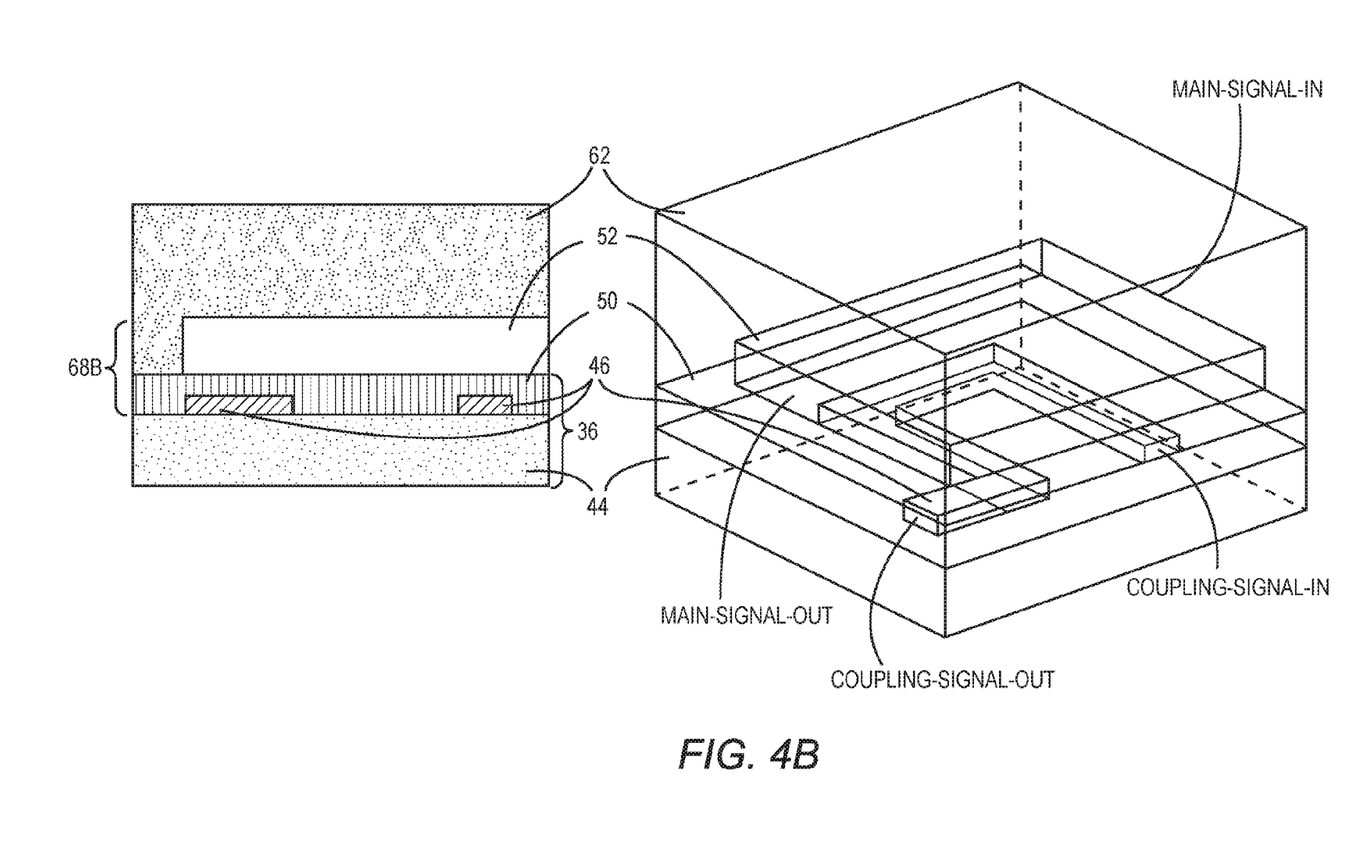

Within the above exemplary multi-layer substrate structure 34 provided in FIG. 2A, the overlapping portions of the first die conductive element 46 and the first substrate conductive element 52, and the dielectric layer 50 in-between, may be used to form an electronic component. FIGS. 4A-4B show exemplary electronic components formed inside the exemplary multi-layer substrate structure 34. As illustrated in FIG. 4A, the electronic component formed inside the multi-layer substrate structure 34 may be a capacitor 68A. The overlapping portions of the first die conductive element 46 and the first substrate conductive element 52 are two plates of the capacitor 68A. From the basic capacitance equation of a capacitor C=Ae/d, (C is the capacitance of the capacitor, A is the overlapping area of two plates of the capacitor, e is permittivity of the in-between dielectric layer, and d is the distance between the two plates of the capacitor), variations of the thickness and properties of the in-between dielectric layer 50 would make different capacitances of the capacitor 68A possible. The flexibility of the capacitance of the capacitor 68A thereby may make the capacitor 68A match other electronic components (not shown) on the die 36.

FIG. 4B shows that the electronic component formed inside the multi-layer substrate structure 34 may be a coupler 68B. The first substrate conductive element 52 is used as a primary inductive segment of the coupler 68B residing in a main signal path; while the first die conductive element 46 is used as a secondary inductive segment of the coupler 68B residing in a coupling signal path.

The capacitor 68A or the coupler 68B helps with the size and performance of the multi-layer substrate structure 34 due to their proximity to the die 36. The capacitor 68A or the coupler 68B is directly coupled to the die 36 without any unwanted wiring or solder bumps. This direct connection reduces the design size and parasitic capacitance and/or inductance that may affect performance. In addition, the capacitor 68A may be used as a bypass capacitor to get unwanted signals away efficiently from circuits (not shown) on the die 36 due to its proximity to the circuits on the die 36.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
   a core layer having a cavity;
   a die mounted within the cavity by a mounting material, wherein the die includes a die body, a first die conductive element on a top surface of the die body, and a first dielectric layer over the first die conductive element;
   a first substrate conductive element formed over a portion of a top surface of the core layer and extending over at least a portion of the first die conductive element; and a second dielectric layer sandwiched between the first substrate conductive element and the first dielectric layer, wherein:
the first dielectric layer and the second dielectric layer are formed of different materials;
overlapping portions of the first die conductive element and the first substrate conductive element are separated and electronically isolated by the first dielectric layer and the second dielectric layer; and
the overlapping portions of the first die conductive element and the first substrate conductive element, and the first dielectric layer and the second dielectric layer in between form an electronic component.

2. The apparatus of claim 1 wherein the electronic component is a capacitor, and the overlapping portions of the first die conductive element and the first substrate conductive element are plates for the capacitor.

3. The apparatus of claim 1 wherein the electronic component is a coupler, and the first substrate conductive element and the first die conductive element are used as a primary inductive segment and a secondary inductive segment of the coupler, respectively.

4. The apparatus of claim 1 wherein the mounting material is one of a group consisting of epoxy, resin, and epoxy resin.

5. The apparatus of claim 1 further comprising outer substrate layers over the core layer.

6. The apparatus of claim 5 wherein the outer substrate layers are formed of one of a group consisting of epoxy, resin, and epoxy resin.

7. The apparatus of claim 5 further comprising a first via structure coupled to the first substrate conductive element and formed through the outer substrate layers and the core layer.

8. The apparatus of claim 1 further comprising outer substrate layers on opposite sides of the core layer.

9. The apparatus of claim 1 further comprising a second die conductive element on the top surface of the die body and a second substrate conductive element formed over a portion of the top surface of the core layer and electronically coupled to the second die conductive element.

10. The apparatus of claim 9 wherein the first substrate conductive element and the second substrate conductive element are electronically isolated and reside in a common metal layer.

11. The apparatus of claim 9 wherein the first substrate conductive element and the second substrate conductive element comprise:
a first layer comprising nickel; and
a second layer comprising copper.

12. The apparatus of claim 9 further comprising
a metal bump on top of the second die conductive element, wherein
the second substrate conductive element is electronically coupled to the metal bump and the first dielectric layer is not over the metal bump.

13. The apparatus of claim 1 wherein the first dielectric layer is formed of one of a group consisting of silicon oxide, silicon nitride, polyamide, and tantalum pentoxide.

14. The apparatus of claim 1 wherein the first die conductive element is formed of one of a group consisting of copper, aluminum, gold, or alloy.

15. The apparatus of claim 1 wherein the first die conductive element has a thickness between 1 µm and 6 µm.

16. The apparatus of claim 1 wherein the first substrate conductive element has a thickness between 10 µm and 15 µm.

17. The apparatus of claim 1 wherein a thickness of the first dielectric layer between the first die conductive element and the second dielectric layer is between 0.25 µm and 5 µm.

18. The apparatus of claim 1 wherein a thickness of the second dielectric layer is between 2 µm and 10 µm.

19. The apparatus of claim 1 wherein the second dielectric layer is formed of one of a group consisting of silicon oxide, silicon nitride, polyamide, and tantalum pentoxide.

20. An apparatus comprising:
a core layer having a cavity;
a die mounted within the cavity by a mounting material, wherein the die includes a die body, a first die conductive element on a bottom surface of the die body, and a first dielectric layer covering the first die conductive element;
a first substrate conductive element underneath a portion of a bottom surface of the core layer and extending over at least a portion of the first die conductive element;
a second dielectric layer sandwiched between the first substrate conductive element and the first dielectric layer, wherein:
the first dielectric layer and the second dielectric layer are formed of different materials;
overlapping portions of the first die conductive element and the first substrate conductive element are separated and electronically isolated by the first dielectric layer and the second dielectric layer; and
the overlapping portions of the first die conductive element and the first substrate conductive element, and the first dielectric layer and the second dielectric layer in between form an electronic component; and
outer substrate layers underneath the core layer.

* * * * *